(12) United States Patent
Ye (10) Patent No.: US 11,954,275 B2
(45) Date of Patent: Apr. 9, 2024

(54) DISPLAY PANEL AND DISPLAY DEVICE (71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 691 days.

(21) Appl. No.: 17/254,268

(22) PCT Filed: Aug. 21, 2020

(86) PCT No.: PCT/CN2020/110375
§ 371 (c)(1),
(2) Date: Dec. 19, 2020

(87) PCT Pub. No.: WO2022/032704
PCT Pub. Date: Feb. 17, 2022

(65) Prior Publication Data
US 2022/0291769 A1  Sep. 15, 2022

(30) Foreign Application Priority Data

Aug. 11, 2020  (CN) .......................... 202010799173.X (51) Int. Cl.
*G06F 3/041* (2006.01)
*H10K 59/122* (2023.01)
*H10K 59/40* (2023.01)

(52) U.S. Cl.
CPC ......... *G06F 3/0412* (2013.01); *H10K 59/122* (2023.02); *G06F 2203/04102* (2013.01); *H10K 59/40* (2023.02)

(58) Field of Classification Search
CPC .... G06F 3/0412; G06F 3/0446; G06F 3/0448; G06F 2203/04102; G06F 2203/04111;
(Continued)

(56) References Cited

U.S. PATENT DOCUMENTS

2016/0202817 A1   7/2016  Choi et al.
2018/0247807 A1*  8/2018  He ................... H01L 21/02107
(Continued)

FOREIGN PATENT DOCUMENTS

CN    103472951 A   12/2013
CN    203535595 U    4/2014
(Continued)

OTHER PUBLICATIONS

International Search Report in International application No. PCT/CN2020/110375,dated Apr. 29, 2021.
(Continued)

*Primary Examiner* — Sitaramarao S Yechuri
(74) *Attorney, Agent, or Firm* — PV IP PC; Wei Te Chung; Zhigang Ma (57) ABSTRACT

A display panel and a display device are provided. By providing a winding structure with a hollow part on an electrode trace of a touch function layer, a parasitic capacitance between the touch function layer and a cathode layer at a pillar can be reduced. Furthermore, an overall consistency of the parasitic capacitance between the touch function layer and the cathode layer is balanced, noise caused by imbalance of the parasitic capacitance is avoided, and an overall touch report rate and sensitivity are improved.

15 Claims, 7 Drawing Sheets

(58) Field of Classification Search
CPC ........ G06F 2203/04112; H10K 59/122; H10K 59/40; H10K 59/126; H10K 59/179; G09F 9/301
See application file for complete search history.

(56) References Cited

U.S. PATENT DOCUMENTS

2019/0252469 A1* 8/2019 Xiao .................... H10K 59/122
2020/0411597 A1* 12/2020 Fang .................... G06F 3/0443

FOREIGN PATENT DOCUMENTS

| CN | 106371649 A | 2/2017 |
| CN | 107342370 A | 11/2017 |
| CN | 206696569 U | 12/2017 |
| CN | 110286803 A | 9/2019 |
| CN | 212277199 U | 1/2021 |

OTHER PUBLICATIONS

Written Opinion of the International Search Authority in International application No. PCT/CN2020/110375, dated Apr. 29, 2021.

* cited by examiner

DISPLAY PANEL AND DISPLAY DEVICE

RELATED APPLICATIONS

This application is a Notional Phase of PCT Patent Application No. PCT/CN2020/110375 having international filing date of Aug. 21, 2020, which claims the benefit of priority of Chinese Patent Application No. 202010799173.X filed on Aug. 11, 2020. The contents of the above applications are all incorporated by reference as if fully set forth herein in their entirety.

FIELD OF INVENTION

The present application relates to the field of display technologies, in particular to the field of touch technologies, and more particularly to a display panel and a display device.

BACKGROUND OF INVENTION

Flexible organic light emitting diode (OLED) displays have advantages of active light emission, large viewing angle, wide color gamut, high brightness, fast response speed, low power consumption, and flexibility in structure. OLED displays are becoming more and more popular in the market, and there is a trend to gradually replace liquid crystal displays (LCDs) as a mainstream of display technologies.

In a conventional technical solution, a pixel definition layer (PDL) is provided on a side of a substrate. A photo spacer (PS) is provided on the surface of the pixel definition layer. In an OLED evaporation process, the photo spacer is used to support a high-precision fine metal mask (FMM). The photo spacer has a certain height, so that a distance between a cathode layer and a touch electrode layer on the photo spacer becomes smaller. This increases a parasitic capacitance, which causes a capacitive reactance and/or impedance of a touch signal to increase, and a delay thereof increases. This seriously affects touch sensitivity and touch report rate in a projection area and a surrounding area of the photo spacer.

Technical Problem

The present application provides a display panel and a display device, which solves an issue of unbalanced parasitic capacitance due to a reduced distance between a cathode layer and a touch function layer at a pillar.

SUMMARY OF INVENTION

In a first aspect, the present application provides a display panel. The display panel comprises a pixel definition layer; a cathode layer covering the pixel definition layer; a pillar positioned between the pixel definition layer and the cathode layer; and a touch function layer disposed on a side of the cathode layer and away from the pixel definition layer, wherein the touch function layer is provided with an electrode trace. The electrode trace is constructed with a winding structure with a hollow part, and the hollow part corresponds to the pillar to reduce a parasitic capacitance between the cathode layer and the touch function layer at a corresponding position of the pillar.

Based on the first aspect, in a first embodiment of the first aspect, an orthographic projection of the pillar and the hollow part at least partially overlap, or an orthographic projection of the hollow part at least partially covers the pillar.

Based on the first aspect, in a second embodiment of the first aspect, the winding structure is formed by the electrode trace having a first width surrounding the hollow part; a width of the electrode trace away from the hollow part is configured to be a second width, and the first width is not greater than the second width.

Based on the second embodiment of the first aspect, in a third embodiment of the first aspect, the first width is not greater than 3 micrometers; the second width is not greater than 5 micrometers.

Based on any of the foregoing embodiments of the first aspect, in a fourth embodiment of the first aspect, the winding structure is electrically connected to the adjacent electrode trace.

Based on the fourth embodiment of the first aspect, in a fifth embodiment of the first aspect, the hollow part is provided with a light shielding block insulated from the electrode trace.

Based on the fifth embodiment of the first aspect, in a sixth embodiment of the first aspect, a cross-sectional shape of the light shielding block is the same as a cross-sectional shape of the pillar.

Based on the sixth embodiment of the first aspect, in a seventh embodiment of the first aspect, a cross-sectional area of the light shielding block is not less than 80% of a cross-sectional area of the pillar and not greater than 120% of the cross-sectional area of the pillar.

Based on the first aspect, in an eighth embodiment of the first aspect, the display panel further comprises a plurality of sub-pixels; and an orthographic projection of the electrode trace is located between adjacent sub-pixels.

In a second aspect, the present application provides a display device. The display device comprises a pixel definition layer; a cathode layer covering the pixel definition layer; a pillar positioned between the pixel definition layer and the cathode layer; and a touch function layer disposed on a side of the cathode layer and away from the pixel definition layer, wherein the touch function layer is provided with a first electrode trace and a second electrode trace. The first electrode trace and/or the second electrode trace is constructed with a winding structure with a hollow part, and the hollow part corresponds to the pillar to reduce a parasitic capacitance between the cathode layer and the touch function layer at a corresponding position of the pillar.

DETAILED DESCRIPTION OF PREFERRED EMBODIMENTS

In order to make the purpose, technical solutions, and effects of the present application clearer, the following further describes the present application in detail with reference to the drawings and embodiments. It should be understood that the specific embodiments described herein are only used to explain the present application, and not used to limit the present application.

Figure 1:
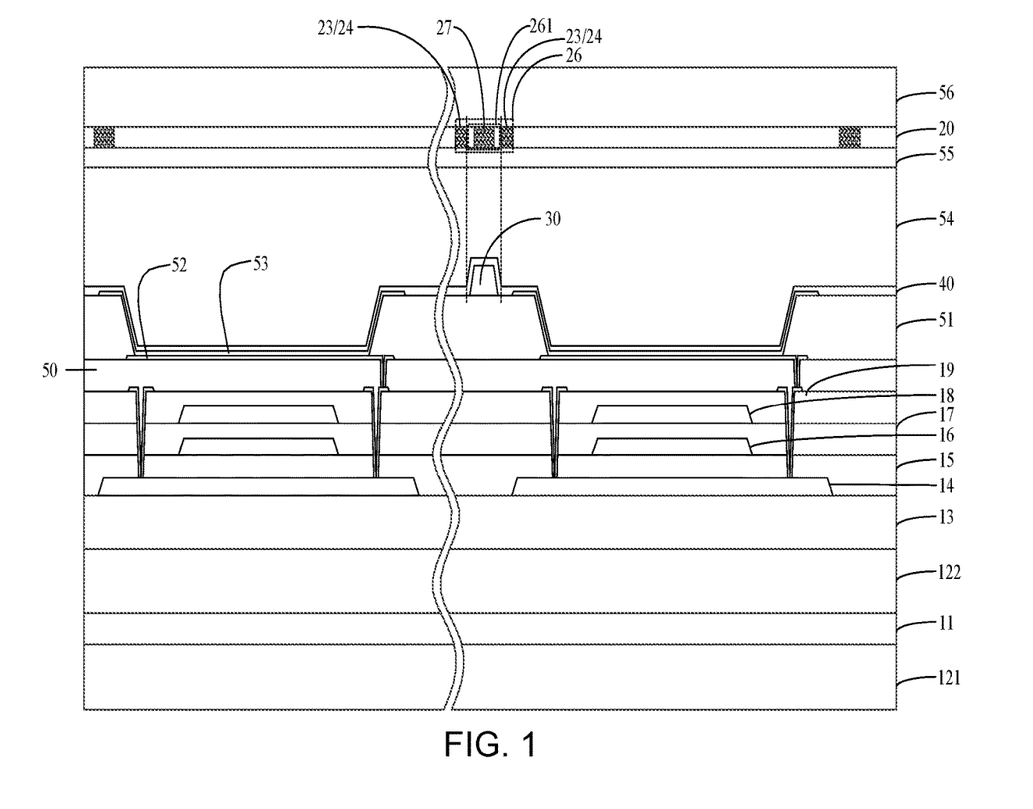
FIG. 1 is a first schematic structural diagram of a display panel/display device according to an embodiment of the present application.
Figure 2:
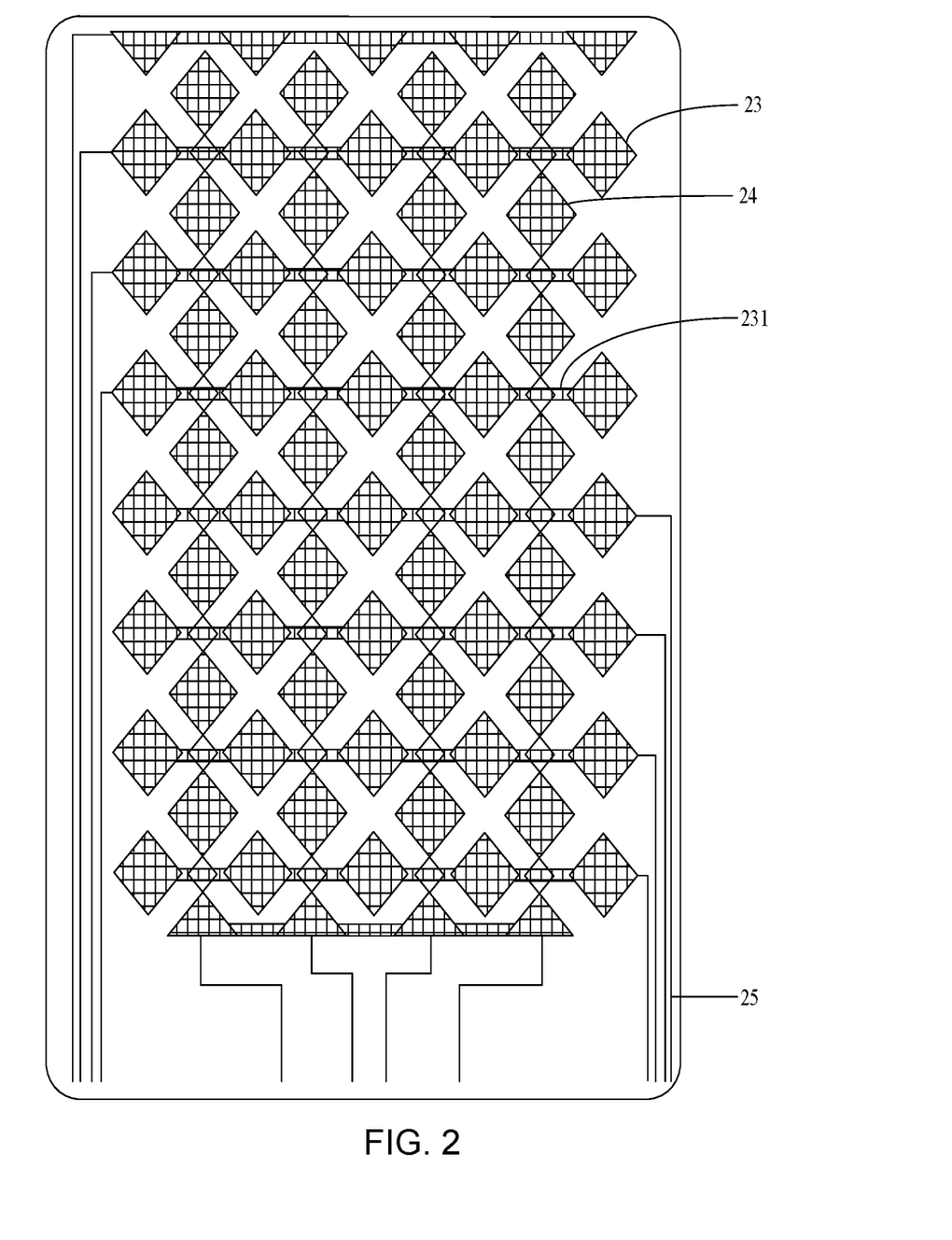
FIG. 2 is a schematic structural diagram of a touch function layer according to an embodiment of the present application.

As illustrated in FIG. 1 and FIG. 2, in one of the embodiments, a display panel or a display device may include, but is not limited to, an anode layer 52, a pixel definition layer 51, a light emitting layer 53, a cathode layer 40, and a touch function layer 20 which are sequentially stacked. A pillar 30 is provided between the pixel definition layer 51 and the cathode layer 40. The pillar 30 raises a corresponding position of the cathode layer 40, so that a distance between the cathode layer 40 and the touch function layer 20 at a corresponding position of the pillar 30 becomes smaller. In view of this, the touch function layer 20 in this embodiment is provided with an electrode trace. The electrode trace is constructed with a winding structure 26 with a hollow part 261. The hollow part 261 corresponds to the pillar 30. The hollow part 261 can form a non-electrical area, which can reduce electrical coupling between the cathode layer 40 and the touch function layer 20 at the corresponding position of the pillar 30. Therefore, parasitic capacitance generated thereby is reduced to balance an overall consistency of a parasitic capacitance between the touch function layer 20 and the cathode layer 40. This avoids noise caused by unbalanced parasitic capacitance, and helps to improve an overall touch report rate and sensitivity.

The touch function layer 20 at least includes a first conductive layer, a second conductive layer, and an insulating layer located between the first conductive layer and the second conductive layer. The first conductive layer may include a bridge trace 231 remaining after etching. The second conductive layer is provided with an electrode trace remaining after etching. The electrode trace includes a first electrode trace 23 and a second electrode trace 24. The bridge trace 231 may be used as a part of the first electrode trace 23 or the second electrode trace 24. The first electrode trace 23 or the second electrode trace 24 is connected through a first via hole at an intersection of the first electrode trace 23 and the second electrode trace 24 to electrically isolate the first electrode trace 23 and the second electrode trace 24. The electrode trace is constructed with a winding structure 26 with a hollow part 261, and the hollow part 261 corresponds to the pillar 30 to reduce the parasitic capacitance between the cathode layer 40 and the touch function layer 20 corresponding to the pillar 30. It should be noted that electrical isolation in this embodiment means that there is no direct electrical connection, and it is not excluded that the two can be coupled through a third party, such as a human body or a stylus.

Figure 9:
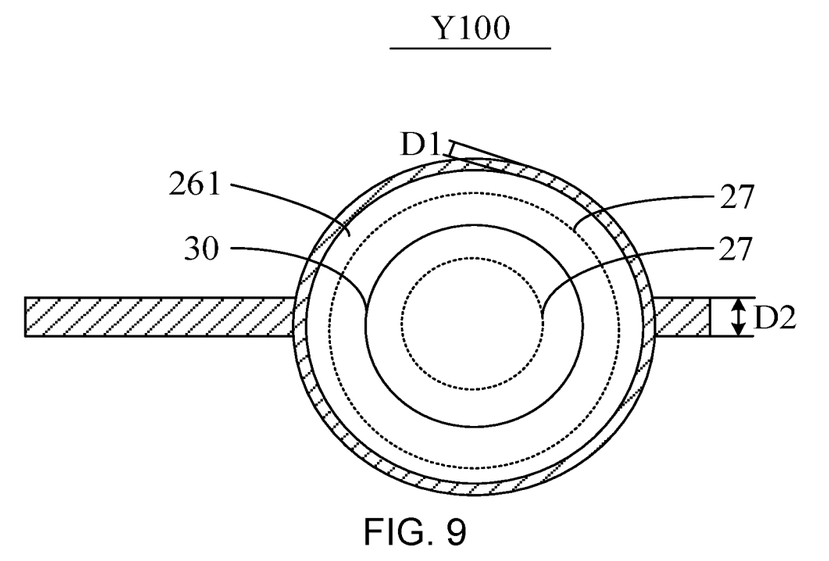
FIG. 9 is a partial enlarged schematic diagram of Y100 shown in FIG. 4.

In an embodiment, as shown in FIG. 9, the winding structure 26 is formed by an electrode trace with a first width D1 surrounding the hollow part 261. A width of the electrode trace away from the hollow part 261 is configured as a second width D2, and the first width D1 is not greater than the second width D2. The first width D1 is not greater than 3 microns; the second width D2 is not greater than 5 microns.

In an embodiment, the winding structure 26 is electrically connected to an adjacent electrode trace. Specifically, as shown in FIG. 9, the winding structure 26 is electrically connected to the adjacent electrode trace having the second width D2 through the electrode trace having the first width D1. The etching process of the electrode trace having the first width D1 and the electrode trace having the second width D2 can be formed simultaneously. It can be understood that, during the formation of the entire electrode trace, if it encounters a position corresponding to the pillar 30, the electrode trace is continuously arranged in two to avoid an orthographic projection position of the pillar 30.

An orthographic projection of the pillar 30 and the hollow part 261 at least partially overlap or may completely overlap. Alternatively, the orthographic projection of the hollow part 261 at least partially covers the pillar 30 or may completely cover the pillar 30.

As shown in FIG. 1, it can be understood that, in this embodiment, an encapsulation layer 54 and a touch buffer layer 55 are optionally stacked between the cathode layer 40 and the touch function layer 20.

As shown in FIG. 1, in one of the embodiments, the display panel or the display device may further include a passivation layer 56 optionally disposed on a side of the touch function layer 20 and away from the cathode layer 40.

As shown in FIG. 1, in one of the embodiments, the display panel or the display device may further include a first PI layer 121, a first buffer layer 11, a second PI layer 122, a second buffer layer 13, a polysilicon layer 14, a first GI layer 15, a first gate layer 16, a second GI layer 17, a second gate layer 18, an interlayer insulating layer 19, and a planarization layer 50 that are optionally stacked on an anode layer 52 and/or a pixel definition layer 51 and away from a light emitting layer 53. The polysilicon layer 14 may be connected to the planarization layer 50 through a second via hole. The second via hole sequentially passes through the first GI layer 15, the second GI layer 17, and the interlayer insulating layer 19. At least part of the second via hole is connected to the anode layer 52 through a third via hole located in the planarization layer 50.

As shown in FIG. 1 to FIG. 6, in one of the embodiments, the anode layer 52 located on a side of the cathode layer 40 and away from the touch function layer 20 in the display panel or the display device. The light emitting layer 53 is located between the cathode layer 40 and the anode layer 52. The display panel or the display device may further include a plurality of sub-pixels 531. The pixel definition layer 51 is provided with corresponding pixel openings for exposing the anode layer 52 constituting each sub-pixel 531 to define a corresponding light emitting position of the sub-pixel 531. The light emitting layer 53 is located in the pixel opening.

A shape of the metal mesh formed by the first electrode trace 23 and/or the second electrode trace 24 may correspond to a shape of the sub-pixel 531.

Figure 4:
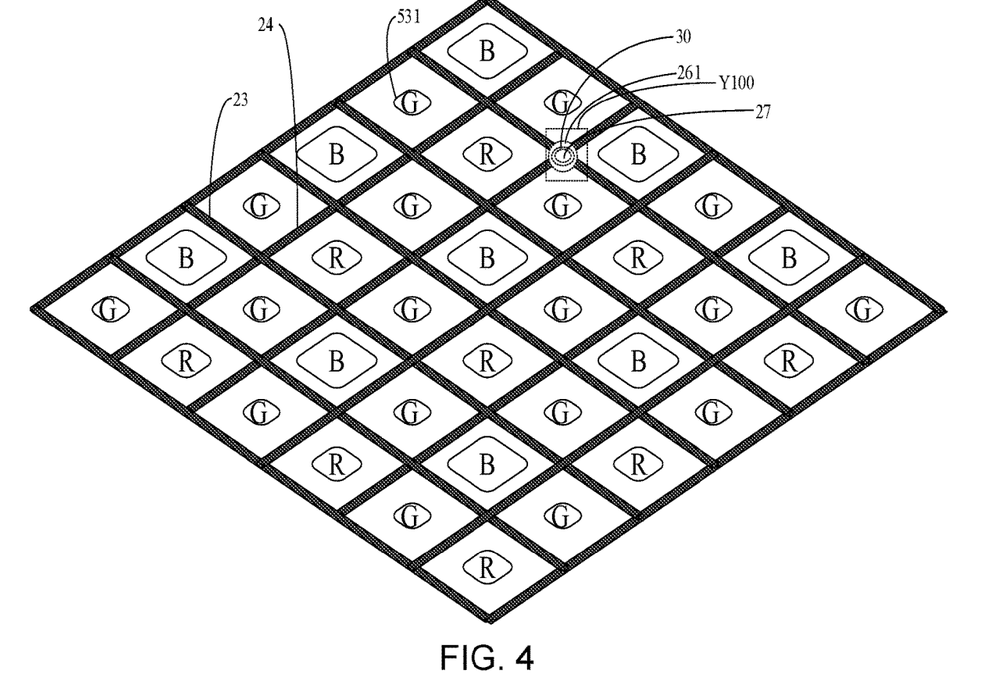
FIG. 4 is a first schematic diagram of projection positions of sub-pixels and a winding structure according to an embodiment of the application.

As shown in FIG. 4, it should be noted that when the sub-pixel 531 has a polygonal structure, the polygonal structure may be square or rectangular, etc., then a line type of a metal grid formed by the first electrode trace 23 and/or the second electrode trace 24 includes at least a straight line. That is, the line type of the first electrode trace 23 and/or the second electrode trace 24 may be, but not limited to, both straight lines or straight segments. Correspondingly, the metal grid formed by the first electrode trace 23 and/or the second electrode trace 24 thus defined also corresponds to a polygonal structure.

Figure 5:
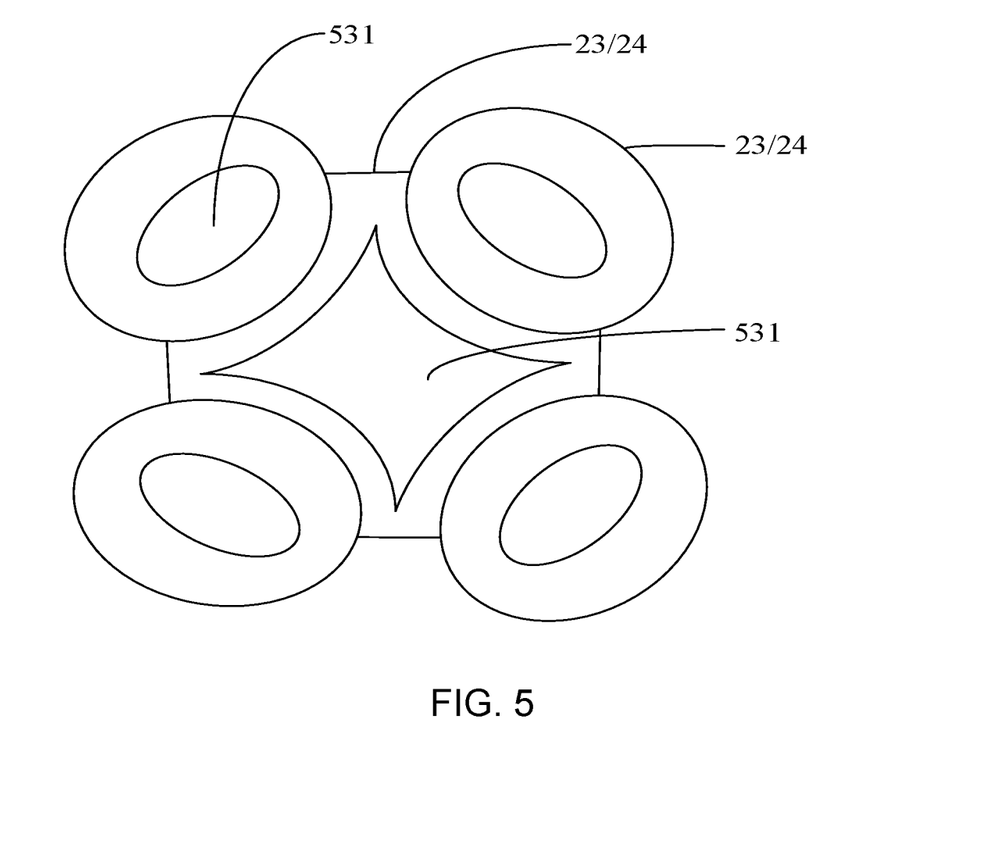
FIG. 5 is a second schematic diagram of projection positions of sub-pixels and a winding structure according to an embodiment of present the application.
Figure 6:
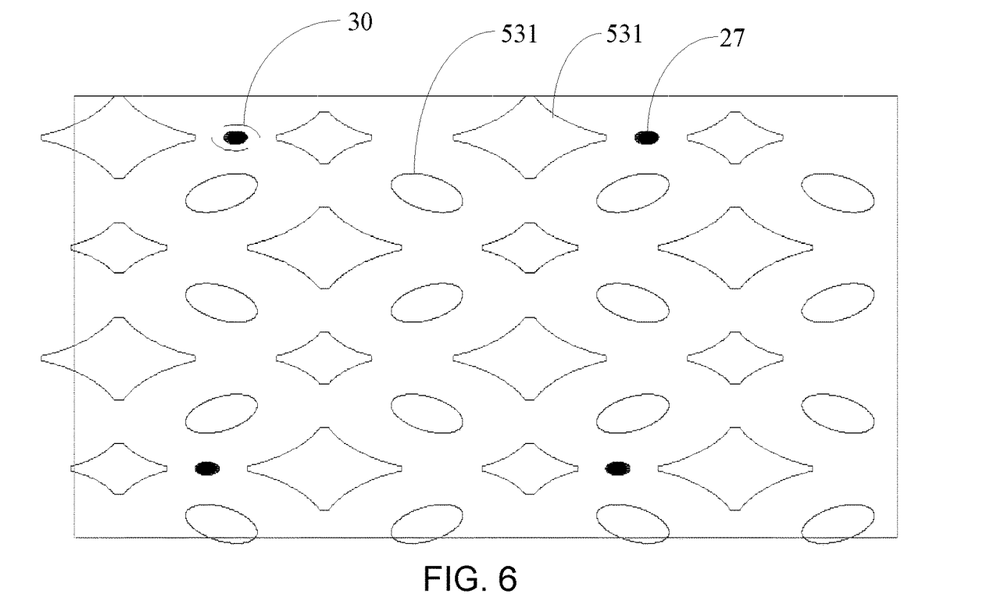
FIG. 6 is a schematic diagram of projection positions between sub-pixels, a pillar, and a light shielding block according to an embodiment of the present application.

As shown in FIG. 5, when the sub-pixel 531 has an arc structure, that is, a shape of the sub-pixel 531 has curved edges or an ellipse with curved edges or pearl type, then the line type of the metal grid formed by the first electrode trace 23 and/or the second electrode trace 24 is defined to include at least a curve, or both are curves, and bending directions of the two are the same.

Figure 3:
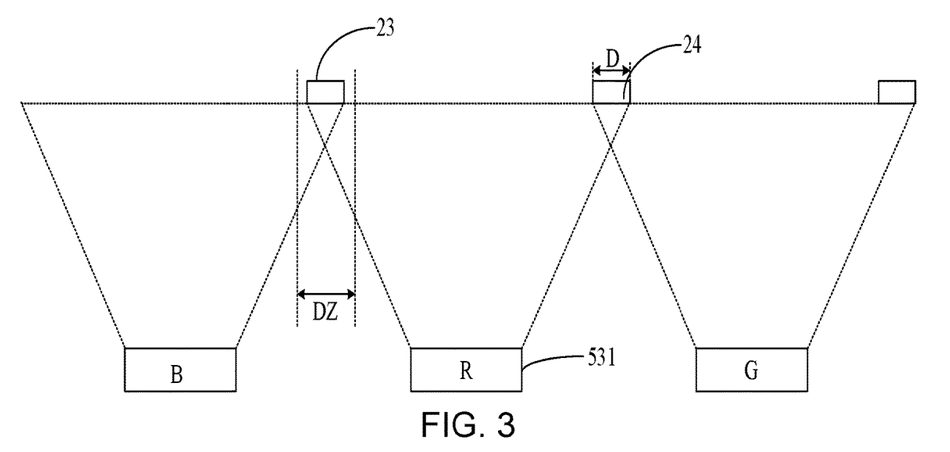
FIG. 3 is a schematic diagram of projection positions of sub-pixels and a first electrode or a second electrode according to an embodiment of the present application.

As shown in FIG. 3 or FIG. 4, in one of the embodiments, an orthographic projection of the first electrode trace 23 and/or the second electrode trace 24 does not overlap the sub-pixel 531. It should be noted that, in this embodiment, the first electrode trace 23 and/or the second electrode trace 24 are always located in a gap between adjacent sub-pixels 531 and located in a middle of the gap. Moreover, a trace of the first electrode trace 23 and/or the second electrode trace 24 is always consistent with a contour of the sub-pixel 531. For example, when the sub-pixel 531 has a polygonal structure, for example, a hexagonal structure, the defined metal grid has a quadrangular structure, then any side of the quadrilateral of the metal grid is always parallel to one side of the hexagonal structure. When the sub-pixel 531 has a first curved side arc structure, correspondingly, the metal grid also has a second curved side arc structure. An orthographic projection of the second curved side arc structure surrounds the first curved side arc structure. A distance from an inner side of the orthographic projection of the second curved side arc structure to an outer side of the first curved side arc structure is always equal or approximate.

In one of the embodiments, the pillar 30 and the pixel definition layer 51 are simultaneously formed by a halftone yellow light process, which can simplify a process and improve process efficiency.

The pillar 30 is located between the adjacent sub-pixels 531 and does not overlap the light emitting layer 53. It should be noted that the pillar 30 is not provided between all adjacent sub-pixels 531, but a pillar 30 is provided every multiple sub-pixels 531. The plurality of sub-pixels 531 may be, but not limited to, 8, or other integers, such as 4, or 12, or 16, and so on.

Specifically, as shown in FIG. 9, FIG. 9 is a partial enlarged schematic diagram shown at Y100 in FIG. 4. The figure shows a positional relationship among orthographic projections of the hollow part 261, a light shielding block 27, and the pillar 30 on a certain plane. The orthographic projection of the pillar 30 and the hollow part 261 may but are not limited to at least partially overlap or may completely overlap. It is also possible that the orthographic projection of the hollow part 261 may, but is not limited to, at least partially cover the pillar 30, or may completely cover the pillar 30, and even the orthographic projection of the hollow part 261 covers the pillar 30 and a part of an area around the pillar 30. It should be noted that the parasitic capacitance between the cathode layer 40 and the touch function layer 20 can be adjusted correspondingly through the overlap or coverage of the hollow part 261 and the pillar 30 on the corresponding orthographic projection.

It should be noted that the degree of overlap or coverage refers to the overlap area or coverage area between the winding structure 26 or the hollow part 261 and the pillar 30 on the orthographic projection. The larger the overlap area or the coverage area, the smaller the parasitic capacitance between the cathode layer 40 and the touch function layer 20 corresponding to the pillar 30. Conversely, the smaller the overlap area or the coverage area of the two, the larger the parasitic capacitance between the cathode layer 40 and the touch function layer 20 corresponding to the pillar 30.

As shown in FIG. 3, a width D of the first electrode trace 23 and/or the second electrode trace 24 corresponding to the pillar 30 can be configured to be a smaller width, so as to reduce the parasitic capacitance between the first electrode trace 23 and/or the second electrode trace 24 and the cathode layer 40 corresponding to the pillar 30. Of course, the width of the first electrode trace 23 and/or the second electrode trace 24 corresponding to the pillar 30 can also be adjusted. It can be understood that, when the hollow part 261 is the same, the smaller the width of the first electrode trace 23 and/or the second electrode trace 24 is, the smaller the parasitic capacitance is. Conversely, the greater the width of the first electrode trace 23 and/or the second electrode trace 24, the greater the parasitic capacitance. In this way, it is possible to fine-tune the parasitic capacitance between the first electrode trace 23 and/or the second electrode trace 24 and the cathode layer 40 corresponding to the pillar 30, which is more beneficial to balance the parasitic capacitance between the cathode layer 40 and the touch function layer 20. DZ (dead zone) is a non-transmissive area of adjacent sub-pixels 531.

As shown in FIG. 1 or FIG. 4, the hollow part 261 is provided with a light shielding block 27 insulated from the first electrode trace 23 and/or the second electrode trace 24. It can be understood that the light shielding block 27 may be, but not limited to, located in the same film layer as the first electrode trace 23 and/or the second electrode trace 24. After etching, the light shielding block 27 is electrically isolated from the first electrode trace 23 and/or the second electrode trace 24. That is, the light shielding block 27 has no current flow. Therefore, there is no parasitic capacitance between the light shielding block 27 and other conductive layers, or the first electrode trace 23 and/or the second electrode trace 24. Or, even if there is parasitic capacitance, it is so weak that it can be ignored.

It should be noted that the light shielding block 27 is placed in the hollow part 261. The light shielding block 27 can be infinitely close to the winding structure 26 or filled in the hollow part 261. However, the light shielding block 27 and the winding structure 26 are electrically isolated. This ensures that the light shielding block 27 is in an insulated state, and the parasitic capacitance generated by the light shielding block 27 can be avoided.

As shown in FIG. 9, in one of the embodiments, a cross-sectional shape of the shading block 27 and a cross-sectional shape of the pillar 30 are the same and are arranged correspondingly. It is understandable that the cross-sectional shapes of the two are the same and the corresponding arrangements mean that the shapes of the two are the same or similar, and an orthographic projection of one of them can be completely overlapped or overlapped with the other after being scaled appropriately. This arrangement can prevent the touch function layer 20 from having a small hole that can transmit light, which may cause optical diffraction or optical interference issues in the touch function layer 20 above the pillar 30.

In an embodiment, a cross-sectional area of the light shielding block 27 is not less than 80% of a cross-sectional area of the pillar 30 and not more than 120% of the cross-sectional area of the pillar 30. It can be understood that the limitation of the area relationship between the two can prevent the touch function layer 20 from having a small hole that can transmit light, which may cause optical diffraction or optical interference issues in the touch function layer 20 above the pillar 30.

The orthographic projection of the pillar 30 does not overlap the sub-pixel 531; and the orthographic projection of the first electrode trace 23 and/or the second electrode trace 24 is located between adjacent sub-pixels 531. Specifically, it may be located in the middle of the adjacent sub-pixel 531.

Figure 7:
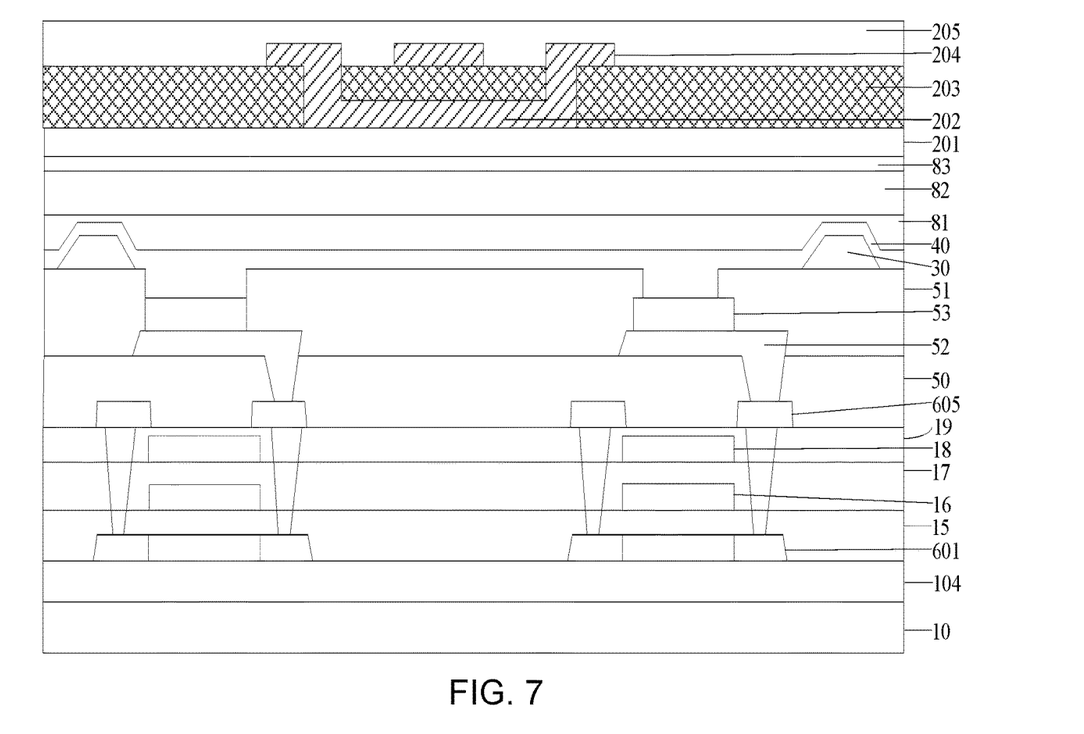
FIG. 7 is a second schematic structural diagram of a display panel/display device according to an embodiment of the present application.

As shown in FIG. 7, in one of the embodiments, the display panel or the display device may include a substrate 10, a first buffer layer 104, an active layer 601, a first GI layer 15, a first gate layer 16, a second GI layer 17, a second gate layer 18, an interlayer insulating layer 19, a source and drain layer 605, a planarization layer 50, a pixel definition layer 51, an anode layer 52, a light emitting layer 53, a pillar 30, a cathode layer 40, a first vapor deposition layer (CVD) 81, a monomer inkjet layer 82, a second vapor deposition layer (CVD) 83, a second buffer layer 201, a bridge conductive layer 202, a first passivation layer 203, an induction conductive layer 204 and a second passivation layer 205 which are sequentially stacked. The material of the first vapor deposition layer (CVD) 81 may be SiNx or SiON. The material of the second vapor deposition layer (CVD) 83 may be SiNx or SiOx. The material of the first passivation layer 203 may be SiNx.

Figure 8:
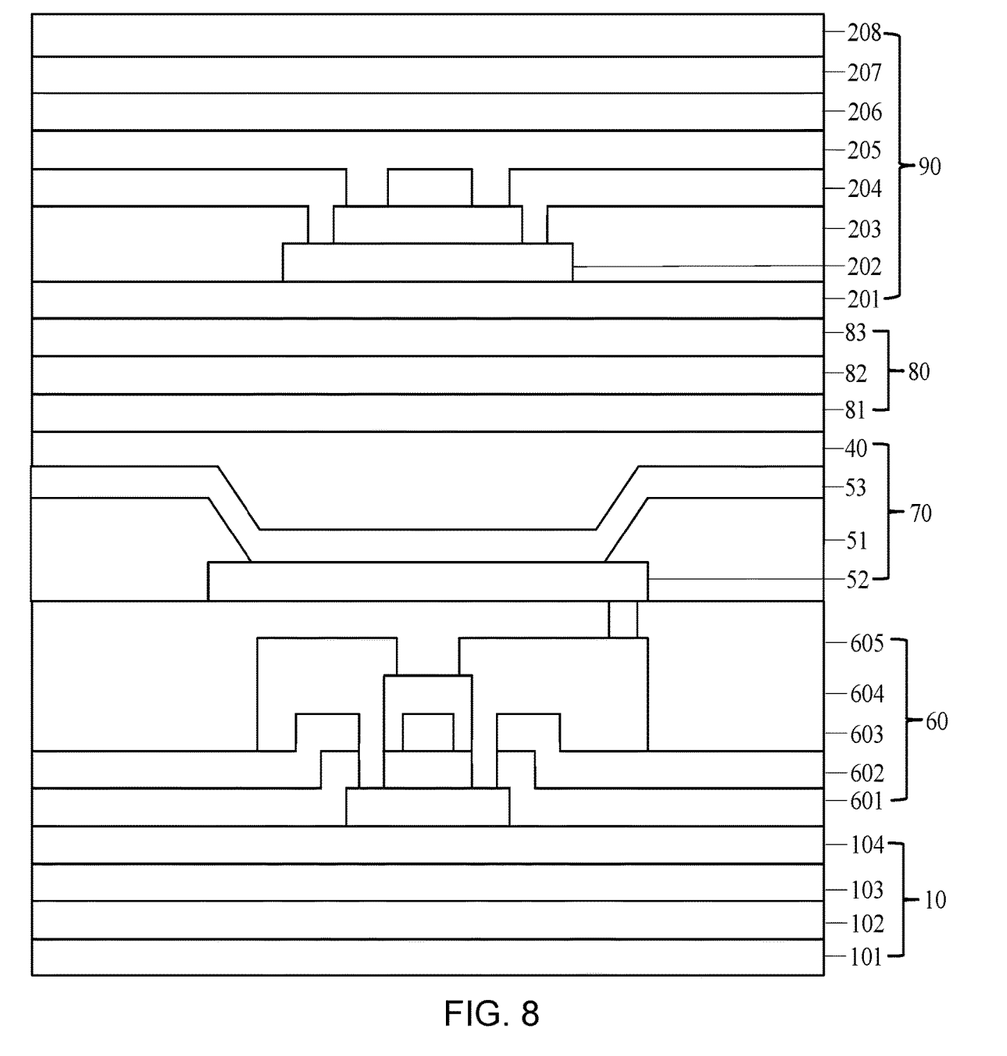
FIG. 8 is a third schematic structural diagram of a display panel/display device according to an embodiment of the present application.

As shown in FIG. 8, in one of the embodiments, the display panel or the display device may include a substrate 10, a thin film transistor layer 60, a light emitting function layer 70, an encapsulation layer 80, and a touch function layer 90 which are sequentially stacked.

The substrate 10 includes a layer protection film 101, a double PI layer 102, a barrier layer 103 made of SiNx/SiOx material, and a first buffer layer 104 made of SiNx/SiOx material which are sequentially stacked.

The thin film transistor layer 60 includes an active layer 601, a gate insulating layer 602, a gate layer 603, an interlayer insulating layer 604, and a source and drain layer 605 which are sequentially stacked.

The light emitting function layer 70 includes a pixel definition layer 51, an anode layer 52, a light emitting layer 53, and a cathode layer 40 which are sequentially stacked. The anode layer 52 includes at least one of indium tin oxide and silver. The cathode layer 40 may be a lithium fluoride (LiF) material layer or a caprolactam (CPL) material layer.

The encapsulation layer 80 includes a first vapor deposition layer (CVD) 81, a monomer inkjet layer 82, and a second vapor deposition layer (CVD) 83 which are sequentially stacked.

The touch function layer 90 includes a second buffer layer 201, a bridge conductive layer 202, a first passivation layer 203, an inductive conductive layer 204, a second passivation layer 205, a polarizing layer 206, an optical adhesive layer 207, and a window layer 208 which are sequentially stacked. The bridge conductive layer 202 and the inductive conductive layer 204 constitute the touch function layer 20.

In one of the embodiments, flexible OLEDs are classified into top-emitting type and bottom-emitting type according to their light-emitting positions. The structure of the top-emitting OLED panel includes a thin film transistor array (TFT array) substrate, an anode layer, a pixel definition layer (PDL/PS), an organic light emitting layer (EL), a cathode layer, a thin film encapsulation layer (TFE), and a touch electrode layer with a metal mesh winding structure 26 located above the TFE in sequence from bottom to top.

As shown in FIG. 2, the metal mesh touch electrode layer located above the OLED thin film encapsulation layer (TFE) in the present invention includes a first electrode trace 23 as a touch driving electrode and a second electrode trace 24 as a touch sensing electrode. Alternatively, the first electrode trace 23 may be used as a touch sensing electrode, and the second electrode trace 24 may be used as a touch driving electrode. The touch driving electrode and the touch sensing electrode are connected to a touch chip (touch IC) through a peripheral metal circuit 25.

The flexible AMOLED on-cell touch screen has a single-layer bridge structure of mutual capacitance touch screen, and the material is hollowed out metal mesh.

The cross-sectional structure includes a bridge layer, an insulating layer, and an electrode (Tx/Rx) layer from bottom to top. The electrode layer is located above the insulating layer, and the bridge layer is extremely located below the insulating layer.

The first electrode trace 23 and the second electrode trace 24 are located on the same layer and are electrically insulated from each other. The first electrode trace 23 and the second electrode trace 24 are arranged orthogonally in an array. The first electrode trace 23 or the second electrode trace 24 cut off at a cross position is connected to the bridge trace 231 in the lower bridge layer through the insulating layer in the middle, thereby maintaining continuous electrical conduction.

If the bridge trace 231 is connected to the first electrode trace 23 that is separated, the bridge trace 231 is a part of the first electrode trace 23. If the bridge trace 231 is connected to the second electrode trace 24 that is separated, the bridge trace 231 is a part of the second electrode trace 24. The bridge trace 231 only occupies a small part of the first electrode trace 23 or the second electrode trace 24, and may usually be composed of at least one metal wire (mesh) in a very small number.

It can be understood that each of the first electrode trace 23 and/or the second electrode trace 24 includes at least one metal wire.

There are pillars 30 (PS, photo spacer)/pixel definition layer (PDL) on the AMOLED array substrate. PS is a pillar on a surface of the PDL distributed according to a certain rule, used to support FMM (fine metal mask, high-precision metal mask-used in the OLED evaporation process) in the process of vapor deposition of RGB luminous pixels. For example, on the surface of the PDL, a PS pillar is arranged every 8 sub-pixels 531.

The PDL layer is mainly used to define a specific position of a light-emitting pixel, there is a corresponding pixel opening, which is used to expose an anode electrode of the corresponding light-emitting pixel and to deposit multiple layers of light-emitting materials.

PS and PDL can be produced in one manufacturing process, such as halftone yellow light manufacturing process. Then multiple layers of light-emitting materials (EL) are deposited on a top of the PS/PDL. Finally, an entire cathode layer is fabricated above the EL/PS/PDL layer.

Since the pillar 30 has a certain height, a distance between the cathode deposited on the PS and an upper touch electrode is smaller than a distance between the cathode deposited at a non-PS pillar position and the upper touch electrode. The touch electrode includes a first electrode trace 23 and a second electrode trace 24.

Usually, the PS is located at the middle gap between adjacent pixel openings on the PDL and is fabricated on the upper surface of the PDL layer. At the same time, the metal mesh touch electrode located above the EL layer/cathode layer/encapsulation layer (TFE) is also made at the gap between adjacent PDL pixel openings in order to avoid shading.

Generally, the PS pillar and the metal mesh touch electrode overlap in a vertical direction. Therefore, parasitic capacitance of the upper touch electrode at the PS position is larger than the parasitic capacitance of the upper touch electrode at the non-PS position. Larger parasitic capacitance will result in greater display noise coupling. At the same time, larger parasitic capacitance will cause a larger RC Delay of a touch signal. This affects a touch report rate and sensitivity characteristics. In view of this, the present disclosure provides a display panel and a display device. By providing a winding structure 26 with a hollow part 261 on the electrode trace of the touch function layer 20, parasitic capacitance between the touch function layer 20 and the cathode layer 40 at the pillar 30 can be reduced. Furthermore, an overall consistency of the parasitic capacitance between the touch function layer 20 and the cathode layer 40 is balanced. This avoids noise caused by unbalanced parasitic capacitance, and helps to improve an overall touch report rate and sensitivity.

It can be understood that for those of ordinary skill in the art, equivalent replacements or changes can be made according to the technical solution of the present application and its inventive concept. All these changes or replacements shall fall within the protection scope of the appended claims of the present application.

What is claimed is:

1. A display panel, comprising:
a pixel definition layer;
a cathode layer covering the pixel definition layer;
a pillar positioned between the pixel definition layer and the cathode layer; and
a touch function layer disposed on a side of the cathode layer and away from the pixel definition layer, wherein the touch function layer is provided with an electrode trace;
wherein the electrode trace is constructed with a winding structure with a hollow part, and the hollow part corresponds to the pillar to reduce a parasitic capacitance between the cathode layer and the touch function layer at a corresponding position of the pillar;
wherein the display panel further comprises a plurality of sub-pixels; and an orthographic projection of the electrode trace is located between adjacent sub-pixels;
wherein the winding structure is electrically connected to the adjacent electrode trace, the hollow part is provided with a light shielding block insulated from the electrode trace, and a cross-sectional shape of the light shielding block is the same as a cross-sectional shape of the pillar.

2. The display panel according to claim 1, wherein an orthographic projection of the pillar and the hollow part at least partially overlap, or an orthographic projection of the hollow part at least partially covers the pillar.

3. The display panel according to claim 1, wherein the winding structure is formed by the electrode trace having a first width surrounding the hollow part; a width of the electrode trace away from the hollow part is configured to be a second width, and the first width is not greater than the second width.

4. The display panel according to claim 3, wherein the first width is not greater than 3 micrometers; the second width is not greater than 5 micrometers.

5. The display panel according to claim 1, wherein a cross-sectional area of the light shielding block is not less than 80% of a cross-sectional area of the pillar and not greater than 120% of the cross-sectional area of the pillar.

6. A display panel, comprising:
a pixel definition layer;
a cathode layer covering the pixel definition layer;
a pillar positioned between the pixel definition layer and the cathode layer; and
a touch function layer disposed on a side of the cathode layer and away from the pixel definition layer, wherein the touch function layer is provided with an electrode trace;
wherein the electrode trace is constructed with a winding structure with a hollow part, and the hollow part corresponds to the pillar to reduce a parasitic capacitance between the cathode layer and the touch function layer at a corresponding position of the pillar;
wherein the winding structure is electrically connected to the adjacent electrode trace, the hollow part is provided with a light shielding block insulated from the electrode trace, and a cross-sectional shape of the light shielding block is the same as a cross-sectional shape of the pillar.

7. The display panel according to claim 6, wherein an orthographic projection of the pillar and the hollow part at least partially overlap, or an orthographic projection of the hollow part at least partially covers the pillar.

8. The display panel according to claim 6, wherein the winding structure is formed by the electrode trace having a first width surrounding the hollow part; a width of the electrode trace away from the hollow part is configured to be a second width, and the first width is not greater than the second width.

9. The display panel according to claim 8, wherein the first width is not greater than 3 micrometers; the second width is not greater than 5 micrometers.

10. The display panel according to claim 8, wherein a cross-sectional area of the light shielding block is not less than 80% of a cross-sectional area of the pillar and not greater than 120% of the cross-sectional area of the pillar.

11. A display device, comprising:
a pixel definition layer;
a cathode layer covering the pixel definition layer;
a pillar positioned between the pixel definition layer and the cathode layer; and
a touch function layer disposed on a side of the cathode layer and away from the pixel definition layer, wherein the touch function layer is provided with a first electrode trace and a second electrode trace;
wherein the first electrode trace and/or the second electrode trace is constructed with a winding structure with a hollow part, and the hollow part corresponds to the pillar to reduce a parasitic capacitance between the cathode layer and the touch function layer at a corresponding position of the pillar;
wherein the winding structure is electrically connected to the adjacent electrode trace, the hollow part is provided with a light shielding block insulated from the electrode trace, and a cross-sectional shape of the light shielding block is the same as a cross-sectional shape of the pillar.

12. The display device according to claim 11, wherein an orthographic projection of the pillar and the hollow part at least partially overlap, or an orthographic projection of the hollow part at least partially covers the pillar.

13. The display device according to claim 11, wherein the winding structure is formed by the first electrode trace or the second electrode trace having a first width surrounding the hollow part; a width of the first electrode trace or the second electrode trace away from the hollow part is configured to be a second width, and the first width is not greater than the second width.

14. The display device according to claim 13, wherein the first width is not greater than 3 micrometers; the second width is not greater than 5 micrometers.

15. The display device according to claim 11, wherein a cross-sectional area of the light shielding block is not less than 80% of a cross-sectional area of the pillar and not greater than 120% of the cross-sectional area of the pillar.

\* \* \* \* \*